United States Patent [19]
Shi et al.

[11] Patent Number: 6,107,736
[45] Date of Patent: Aug. 22, 2000

[54] ORGANIC ELECTROLUMINESCENT DISPLAY DEVICE AND METHOD OF FABRICATION

[75] Inventors: Song Q. Shi, Phoenix; Franky So, Tempe, both of Ariz.; Hsing-Chung Lee, Calabasas, Calif.

[73] Assignee: Motorola, Inc., Schaumburg, Ill.

[21] Appl. No.: 08/867,706

[22] Filed: Jun. 2, 1997

[51] Int. Cl.[7] .................................................. H05B 33/12
[52] U.S. Cl. ......................... 313/509; 313/504; 313/506; 428/917
[58] Field of Search .................................. 313/504, 506, 313/509, 499, 505; 428/917

[56] References Cited

U.S. PATENT DOCUMENTS

| | | | |
|---|---|---|---|
| 4,797,890 | 1/1989 | Inaba et al. | 313/499 |
| 5,188,901 | 2/1993 | Shimizu | 313/509 |
| 5,276,380 | 1/1994 | Tang | 313/504 |
| 5,346,776 | 9/1994 | Taniguchi et al. | 313/506 |
| 5,445,899 | 8/1995 | Budzilek et al. | 313/506 |
| 5,479,070 | 12/1995 | Murakami | 313/499 |
| 5,773,931 | 6/1998 | Shi et al. | 313/509 |

*Primary Examiner*—Ashok Patel
*Attorney, Agent, or Firm*—William E. Koch

[57] ABSTRACT

An organic electroluminescent display device including a layer of organic electroluminescent material disposed between electrodes for emitting an optical effect. The electroluminescent layers providing discrete electroluminescent pixels which are electrically isolated from one another by a first dielectric material wall structure and a second dielectric material wall structure. The wall structures provide for reliable manufacturing of the display device and prevent electrical shorting between a first electrically conductive material and a second electrically conductive material.

15 Claims, 2 Drawing Sheets

ORGANIC ELECTROLUMINESCENT DISPLAY DEVICE AND METHOD OF FABRICATION

FIELD OF THE INVENTION

The present invention pertains to display devices and more particularly to light emitting organic electroluminescent information display devices.

BACKGROUND OF THE INVENTION

Generally, a two-dimensional organic LED array for image manifestation apparatus applications is composed of a plurality of organic LEDs (one or more of which form a pixel) arranged in rows and columns. Each individual organic LED in the array is generally constructed with a light transmissive first electrode, an organic electroluminescent medium deposited on the first electrode, and a metallic electrode on top of the organic electroluminescent medium. The electrodes of the LEDs are connected to form a two-dimensional X-Y addressing pattern. In practice, the X-Y addressing pattern is achieved by patterning the light transmissive electrodes in an X direction and patterning the metallic electrodes in a Y direction (or vice versa if desired), with the X and Y directions being perpendicular to each other. The patterning of the electrodes is usually accomplished by either shadow mask or etching techniques. Due to the technical limits of shadow masks, etching processes are generally being utilized for high density information displays, which have pixel pitches less then 0.3 mm.

Organic electroluminescent display (OED) devices formed in the above manner, and especially organic light emitting devices (LEDs) and the like, generally are composed of three layers of organic molecules sandwiched between transparent, conductive and/or metallic conductive electrodes. The three layers include an electron transporting layer, an emissive layer, and a hole transporting layer. Charge carriers specifically, electrons and holes, generated in the electron and hole transporting region, recombine in the emissive layer to give off light. OED devices are attractive due to low weight, thin profile, and low driving voltage, i.e., less than about 20 volts. Hence, they have a potential application in many display devices.

While OED devices may find many applications in consumer and industrial products, a problem remains in the fact that they are not easily fabricated in a manner allowing for consistent device reliability and appropriate yield. In the prior art, it has been suggested to utilize integrated shadow masking to fabricate a pixelated organic electroluminescent display. The integrated shadow masks are generally built on top of the patterned transparent anode with a specific slop profile to avoid the need for angle evaporation. However, there exist a problem in manufacturing reliability, specifically consistency in the manufacturing line with regard to the specific slope profiles of the shadow masks. In addition, there has been shown to be an increase in the cross-talk associated with the device leakage between the anode and the cathode in a pixelated organic electroluminescent display with the integrated shadow mask. The leakage is mainly caused by the poor surface coverage of organic electroluminescent medium at the edge between the shadow mask and anode.

At the present time there exist a need to devise a relatively inexpensive and convenient organic electroluminescent display device, and method of fabrication that provides for increased reliability and consistency in the manufacturing line, as well as reliability in the device, specifically the avoidance of shorting or cross-talk between the integrated electrodes.

Accordingly, it would be highly advantageous to provide a new organic electroluminescent display device, and method of manufacturing which overcomes these problems.

It is a purpose of the present invention to provide for a new and improved organic electroluminescent display device and method of fabrication that is amenable to consistent commercial manufacturing line technology.

It is another purpose of the present invention to provide for a new and improved organic electroluminescent display device and method of fabrication that provides for high throughput, high reliability, and low manufacturing costs.

SUMMARY OF THE INVENTION

The above problems and others are at least partially solved and the above purposes and others are realized in a light emitting display including a transparent substrate having a surface and a first layer of electrically conductive material disposed on the surface of the transparent substrate. There are fabricated a plurality of spacedly disposed light emitting organic elements having a layer of electrically conductive material disposed thereon. The light emitting organic elements are formed on the first layer of electrically conductive material. The plurality of spacedly disposed light emitting organic elements are electrically isolated one from the other by a first dielectric material wall structure and a second dielectric material wall structure disposed between the plurality of spacedly disposed light emitting organic elements.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DESCRIPTION OF THE PREFERRED EMBODIMENTS

Figure 1:
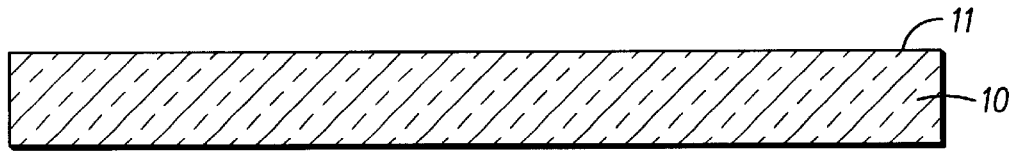
FIGS. 1–6 are a series of cross-sectional views of an organic electroluminescent device and method of fabrication, in accordance with the present invention.

Referring to the drawings, wherein like characters indicate like parts throughout the figures, FIGS. 1–6 illustrate therein both an organic electroluminescent device and a method for fabricating the same. The organic electroluminescent device is fabricated on a substrate 10 having a surface 11 such as that illustrated in FIGS. 1–6. Hence, the first step in the fabrication process is to provide a substrate upon which the organic electroluminescent device may be fabricated. Substrate 10 is preferably transparent, non-electrically conductive, serves as a supportive element and may be fabricated of any of a number of known materials employed in the art. For example, the substrate 10 may be fabricated of a glass such as Corning 7059 glass, transparent plastic substrates made of polyolefins, polyethersulfones, polyarylates, and combinations thereof. In one preferred embodiment, the substrate 10 is fabricated of a glass of quality acceptable for display applications.

Figure 2:
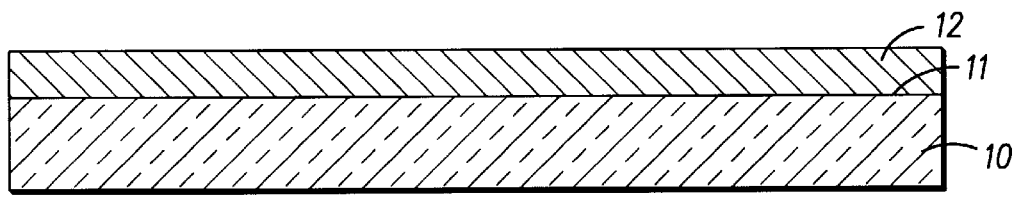

Thereafter, and referring specifically now to FIG. 2, there is deposited atop surface 11 of the substrate 10, a layer of a first electrode material 12 which is electrically conductive and optically transparent or at least semi-transparent. Several materials may be advantageously employed as the first electrode for an organic electroluminescent display (OED)

device. Examples of such materials include conductive metal oxides such as indium oxide, indium tin oxide (ITO), zinc oxide, zinc tin oxide, conductive transparent polymers such as polyaniline and combinations thereof. Alternatively, the electrode 12 may be fabricated of a semi-transparent metal, examples of which include a thin layer (i.e. on the order of less than 500 angstroms) of gold, copper, silver, and combinations thereof. In one preferred embodiment, the electrode 12 is fabricated of either ITO or zinc oxide. It should be understood that first electrode material 12 is patterned to allow for X-Y addressing of the device as previously described.

Figure 3:
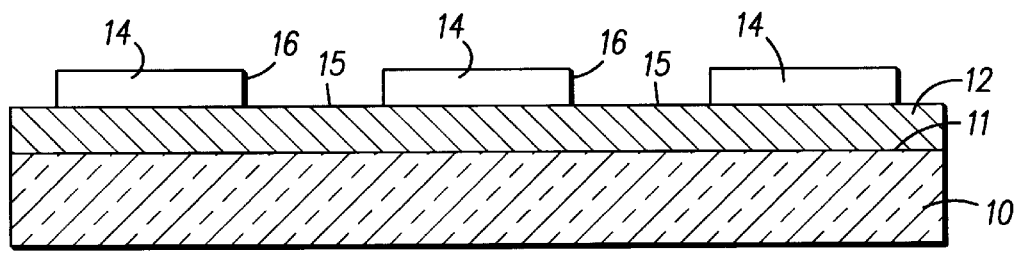

As illustrated in FIG. 3, thereafter, deposited atop the electrode 12 and the exposed areas (not shown) of the substrate 10, is a layer of dielectric material 14. The dielectric material may be fabricated or deposited by any of a number of known techniques in the art. The layer of material 14 is preferably fabricated of a dielectric media such as photoresists, polyimides, photosensitive polyimides, epoxies, photosensitive epoxies, $SiO_x$, $SiN_x$, $SiC_x$, $MgF_x$, and combinations thereof. In one preferred embodiment, the layer of dielectric material is fabricated of photosensitive polyimides, deposited to a total thickness of between 5 nm and 200 nm, and preferably between 10 nm and 100 nm. During operation of the OED device of the present invention, dielectric material layer 14 will prevent any electrical shorting between electrically conductive material layer 12 and the upper layer of conductive metal (discussed presently). In addition, dielectric material layer 14, made of an inorganic dielectric medium, will prevent any contamination from the second dielectric medium (discussed presently), thereby producing a more reliable OED device.

Thereafter, the layer 14 of dielectric material is patterned into dielectric strips utilizing conventional photolithography or any other well known technique in the art, so as to selectively remove portions of dielectric material 14. This is done so as to form a plurality of exposed areas 15 of electrically conductive material 12, as well as a plurality of dielectric wall structures such as 16 of FIG. 3. Each of the wall structures is characterized by a base portion which is adjacent to the layer of electrically conductive material 12, a vertical portion and a top portion which is at the end of the wall structure distanced from the layer 12. Alternatively, dielectric material, or strip, 16 in FIG. 3 may also be directly formed by printing methods.

Figure 4:
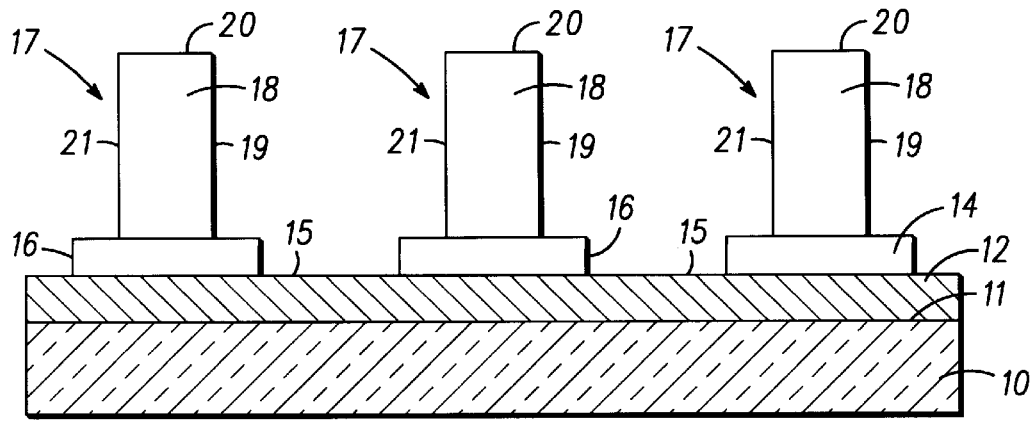

Referring now to FIG. 4, illustrated is the inclusion of a shadow mask layer structure 18, which serves as a second dielectric material layer. Shadow mask layer 18 is deposited on the top portion of etched dielectric material 14, exposed areas 15 of electrically conductive material layer 12 and the exposed areas (not shown) of the substrate 10. Shadow mask layer 18 will serve to automatically pattern the second conductive metal layer (discussed previously) positioned thereupon. Shadow mask layer 18 is patterned into dielectric walls by conventional photolithography or any other well known technique in the art. Once shadow mask layer 18 reaches an initial appropriate thickness of approximately 1 to 10 micrometers, photolithography techniques are used to selectively remove portions of shadow mask layer 18 formed on a portion of dielectric material strip 14 and electrically conductive material layer 12. By selectively removing shadow mask layer 18, a wall structure 17 is defined by sides 19, 20 and 21. As illustrated, wall structure 17 defined by sides 19, 20 and 21 is fabricated having a dimensional width less than strip structure 16 of dielectric material layer 14. The processing techniques needed to produce the different profiles of the dielectric walls disclosed in this invention are well known in the photolithography of silicon technology. Shadow mask layer 18 is preferably fabricated of a dielectric material such as photoresists, polyimides, photosensitive polyimides, epoxies, photosensitive epoxies, $SiO_x$, $SiN_x$, $SiC_x$, $MgF_x$, and combinations thereof.

During operation of the organic electroluminescent device, shadow mask layer 18, in combination with dielectric material layer 14, will prevent any electrical shorting of the device, more specifically, "cross-talk" between the cathode electrodes and leakage between the anode and the cathode defined by electrically conductive material layer 12 and the second conductive metal layer (discussed shortly).

Figure 5:
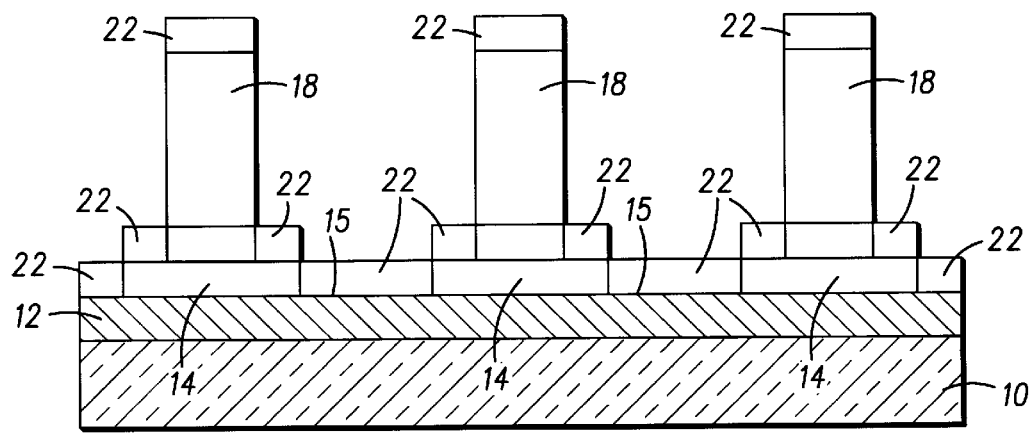

Thereafter, and as illustrated specifically in FIG. 5, a layer of organic electroluminescent material is deposited atop the structure of FIG. 4. As is well known in the art, the organic layers of an organic electroluminescent device comprises at least one and up to five layers of materials: a hole injecting layer, a hole transport layer, an emissive layer, an electron transport layer, and electron injecting layer. For purposes of this invention, the series of layers are illustrated as but one single electroluminescent medium layer 22 deposited on the structure of FIG. 4. Hence, the organic electroluminescent layers are deposited in the fashion so that they coat both the tops of the wall structures of resist shadow mask layer 18 and dielectric material layer 14, as well as the exposed portions 15 therebetween, specifically, the opening between two adjacent wall structures. Thus, a layer of organic electroluminescent medium 22 is disposed atop wall structure 16 and 17, on the exposed area of layer 12, between adjacent wall structures. The exact organic materials selected for use in the layers of the organic electroluminescent material may be any of those known in the art. Organic electroluminescent medium 22 is generally fabricated to a thickness similar to that of dielectric material layer 14, more particularly, organic electroluminescent material layer 22 are generally fabricated between 200–2000 angstroms.

Layer 22 of organic electroluminescent medium can be deposited by vacuum evaporation. Layer 22 of organic electroluminescent medium can also be deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

Figure 6:
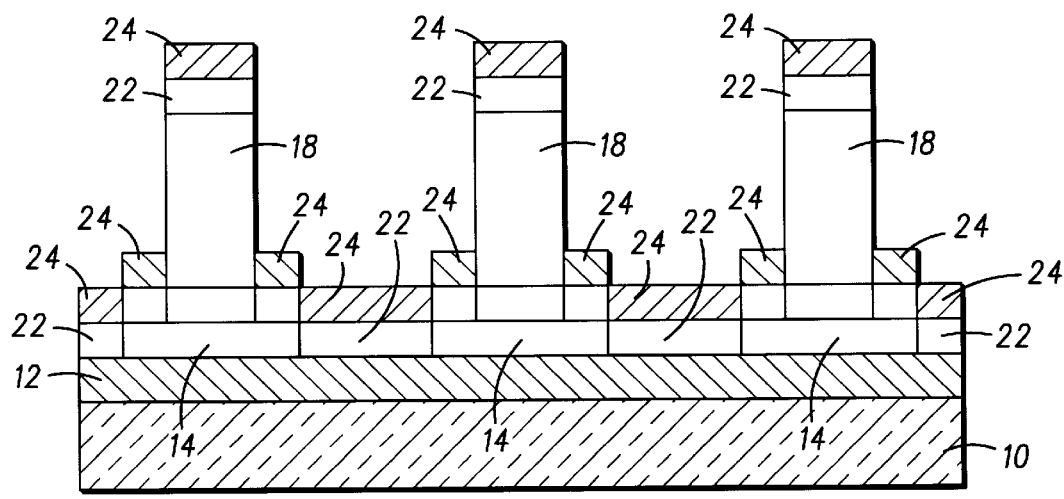

Disposed atop the organic electroluminescent layer 22 is a layer of a second electrode 24 as illustrated in FIG. 6. The second electrode is typically fabricated of a metal of work function of less than 4 electron volts and at least one other protected metal of higher work function. The preferred low work function metal is selected from the group of lithium, magnesium, calcium, strontium, and combinations thereof, while preferred high work function metal is selected from the group of aluminum, indium, copper, gold, silver and combinations thereof. Alternatively, second electrode 24 is formed of a alloy of lower work function metal and a high work function metal by co-evaporation. The content of the low work function metal and the second electrode can vary from 0.1% to 50% but typically is below about 20%. It should be understood that the layer of metal which defines second electrode 24 is automatically patterned due to the underlying wall structures 16 and 17. Accordingly, no mechanical patterning of second electrode 24 is required during the manufacturing of the OED device of the present invention.

As is well known in the art, during operation of the OED device of the present invention, holes inject from the first electrode (also called the anode) 12 and electrons inject from the second electrode 24 (also known as the cathode), into the organic layers 22 disposed between the electrically conductive electrodes, when an electrical current is applied between the anode and the cathode. An electrical current may be applied by connecting the electrodes to electrical current generating means (not shown). The electric current generating means attached to both electrode layer 12 and electrodes 24, and will allow holes and electrons to recombine in the organic layer to generate a desired optical characteristic. Conversely, no current will flow through those portions of layer 22 fabricated atop dielectric material layer 14 and atop resist shadow mask layer 18, since said portions of layer 22 are electrically isolated from both electrode 12 and 24 by dielectric layers 14 and 18. Thus, while layers of organic and electrode materials are deposited atop the wall structures, the wall structures themselves prevent those devices from being operative organic electroluminescent display pixels. Conversely, the devices disposed in the exposed areas between the wall structure 16 and 17 are operative pixel elements which are optically isolated from one another by the wall structures. Hence, a pixelated organic electroluminescent display device, defining a plurality of pixellated picture elements, is provided by means of conventional fabrication processes, without incurring shorting out or cross-talk between the conductive material layers. In addition, the device of the present invention is amenable to consistent commercial manufacturing line technology, provides for a high throughput or yield, high reliability and low manufacturing costs.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A light emitting display comprising:
   a transparent substrate having a surface;
   a first layer of transparent electrically conductive material disposed on the surface of the transparent substrate forming a plurality of laterally spaced apart strips;
   a plurality of spacedly disposed light emitting organic elements with a second layer of electrically conductive material atop, the light emitting organic elements disposed on the first layer of transparent electrically conductive material in a direction orthogonal to the plurality of laterally spaced apart strips of the transparent electrically conductive material; and
   a first dielectric material wall structure having a second dielectric material wall structure disposed thereon, the first dielectric material wall structure disposed between the plurality of spacedly disposed light emitting organic elements.

2. A light emitting display device as claimed in claim 1 wherein the first dielectric material wall structure and the second dielectric material wall structure are formed of a dielectric material selected from the group of $SiO_x$, $SiN_x$, $SiC_x$, $MgF_x$, and combinations thereof.

3. A light emitting display device as claimed in claim 1 wherein the first dielectric material wall structure and the second dielectric material wall structure are formed of a dielectric material selected from the group of photoresists, polyimides, photosensitive polyimides, epoxies, photosensitive epoxies, and combinations thereof.

4. A light emitting display device as claimed in claim 1 wherein the first layer of transparent electrically conductive material is one of optically transparent and semi-transparent.

5. A light emitting display device as claimed in claim 1 wherein the first dielectric material wall structure is formed on a surface of the first layer of electrically conductive material.

6. A light emitting display device as claimed in claim 5 wherein the second dielectric material wall structure is formed on a surface of the first dielectric material wall structure, the second dielectric material wall structure formed having a dimensional width less than the first dielectric material wall structure.

7. A light emitting display device as claimed in claim 1 wherein the plurality of spacedly disposed light emitting organic elements include a layer of organic electroluminescent material.

8. A light emitting display device as claimed in claim 7 wherein the layer of organic electroluminescent material is disposed on a plurality of exposed surfaces of the first layer of transparent electrically conductive material, the first dielectric material wall structure and the second dielectric material wall structure.

9. A light emitting display device as claimed in claim 8 wherein a second layer of electrically conductive material is disposed on a plurality of exposed surfaces of the layer of organic electroluminescent material.

10. A light emitting display device as claimed in claim 1 wherein the second layer of electrically conductive material is formed of at least one of a metal and an alloy having a work function of less than 4 ev.

11. A light emitting display device comprising:
    a supportive non-electrically conductive transparent substrate having disposed on a surface thereof a plurality of laterally spaced apart strips of an electrically conductive material;
    a plurality of first dielectric material wall structures formed on a surface of and orthogonal to the plurality of laterally spaced apart strips of the electrically conductive material and defining a plurality of exposed portions of the electrically conductive material therebetween;
    a plurality of second dielectric material wall structures formed on the plurality of first dielectric material wall structures;
    an organic electroluminescent medium disposed on the plurality of exposed portions of the surface of the electrically conductive material and atop the plurality of first dielectric material wall structures and the plurality of second dielectric material wall structures; and
    a second layer of electrically conductive material disposed on the organic electroluminescent medium.

12. A light emitting display device as claimed in claim 11 wherein the plurality of first dielectric material wall structures and the plurality of second dielectric material wall structures are formed of a dielectric material selected from the group of $SiO_x$, $SiN_x$, $SiC_x$, $MgF_x$, and combinations thereof.

13. A light emitting display device as claimed in claim 11 wherein the plurality of first dielectric material wall structures and the plurality of second dielectric material wall structures are formed of a dielectric material selected from the group of photoresists, polyimides, photosensitive polyimides, epoxies, photosensitive epoxies, and combinations thereof.

14. A light emitting display device as claimed in claim 11 wherein each of the plurality of second dielectric material wall structures is formed having a dimensional width less than each of the plurality of first dielectric material wall structures.

15. A light emitting display device as claimed in claim 11 wherein the second layer of electrically conductive material is formed of at least one of a metal and an alloy having a work function of less than 4 eV.

* * * * *